United States Patent
Ueshima et al.

(10) Patent No.: US 10,354,944 B2
(45) Date of Patent: Jul. 16, 2019

(54) METHOD FOR SOLDERING SURFACE-MOUNT COMPONENT AND SURFACE-MOUNT COMPONENT

(75) Inventors: Minoru Ueshima, Chiba (JP); Minoru Toyoda, Tochigi (JP)

(73) Assignee: Senju Metal Industry Co., Ltd., Tokyo (JP)

(*) Notice: Subject to any disclaimer, the term of this patent is extended or adjusted under 35 U.S.C. 154(b) by 0 days.

(21) Appl. No.: 13/519,217

(22) PCT Filed: Dec. 22, 2010

(86) PCT No.: PCT/JP2010/073849
§ 371 (c)(1),
(2), (4) Date: Jun. 26, 2012

(87) PCT Pub. No.: WO2011/081213
PCT Pub. Date: Jul. 7, 2011

(65) Prior Publication Data
US 2012/0292087 A1    Nov. 22, 2012

(30) Foreign Application Priority Data
Dec. 28, 2009  (JP) .................................. 2009-298932

(51) Int. Cl.
*B23K 35/26* (2006.01)
*H01L 23/495* (2006.01)
(Continued)

(52) U.S. Cl.
CPC .... *H01L 23/49582* (2013.01); *H01L 23/3107* (2013.01); *H01L 23/4334* (2013.01);
(Continued)

(58) Field of Classification Search
CPC ...... B23K 35/26; B23K 35/262; H05K 3/341; H05K 3/3421
(Continued)

(56) References Cited

U.S. PATENT DOCUMENTS 4,888,449 A * 12/1989 Crane et al. .................. 174/540
6,176,947 B1 * 1/2001 Hwang et al. ................ 148/400
(Continued)

FOREIGN PATENT DOCUMENTS

JP    H11 317487 A    11/1999
JP    2001-35978      2/2001
(Continued)

OTHER PUBLICATIONS

Japanese Patent Office, "Notification of Rejection Reason(s)" (translation), Office Action, dated Jul. 9, 2013, 4 pages.
(Continued)

*Primary Examiner* — Devang R Patel
(74) *Attorney, Agent, or Firm* — Chernoff, Vilhauer, McClung & Stenzel, LLP

(57) ABSTRACT

A method for soldering a surface-mount component onto a circuit board. The melting of die-bonding solder material is prevented by using a mounting solder material when soldering a surface-mount component formed using the die-bonding solder material onto a printed circuit board. The surface-mount component, formed using (Sn—Sb)-based solder material having high melting point, the (Sn—Sb)-based solder material containing Cu but not more than a predetermined quantity of Cu constituent and a main ingredient thereof being Sn, is soldered on a board terminal portion of a circuit board using (Sn—Ag—Cu—Bi)-based solder material or (Sn—Ag—Cu—Bi—In)-based solder material as the mounting solder material and with the solder material being applied on the terminal portion. Since solidus temperature of the die-bonding solder material is 243 degrees C. and liquidus temperature of the mounting solder material is about 215 through 220 degrees C., the melting of die-bonding solder material is prevented even at the heating temperature (240 degrees C. or less) of a reflow furnace.

4 Claims, 4 Drawing Sheets

(51) Int. Cl.
*H01L 23/00* (2006.01)
*H01L 23/31* (2006.01)
*H01L 23/433* (2006.01)
*H05K 3/34* (2006.01)

(52) U.S. Cl.
CPC ........ *H01L 23/49513* (2013.01); *H01L 24/05* (2013.01); *H01L 24/06* (2013.01); *H01L 24/29* (2013.01); *H01L 24/32* (2013.01); *H01L 24/83* (2013.01); *H05K 3/3463* (2013.01); *H01L 24/48* (2013.01); *H01L 24/73* (2013.01); *H01L 2224/04026* (2013.01); *H01L 2224/04042* (2013.01); *H01L 2224/05155* (2013.01); *H01L 2224/05644* (2013.01); *H01L 2224/08501* (2013.01); *H01L 2224/293* (2013.01); *H01L 2224/29026* (2013.01); *H01L 2224/29101* (2013.01); *H01L 2224/29109* (2013.01); *H01L 2224/29111* (2013.01); *H01L 2224/29311* (2013.01); *H01L 2224/29447* (2013.01); *H01L 2224/32245* (2013.01); *H01L 2224/32501* (2013.01); *H01L 2224/48091* (2013.01); *H01L 2224/48247* (2013.01); *H01L 2224/48464* (2013.01); *H01L 2224/73265* (2013.01); *H01L 2224/83192* (2013.01); *H01L 2224/83193* (2013.01); *H01L 2224/83455* (2013.01); *H01L 2224/83801* (2013.01); *H01L 2224/85444* (2013.01); *H01L 2224/92247* (2013.01); *H01L 2924/00013* (2013.01); *H01L 2924/00014* (2013.01); *H01L 2924/014* (2013.01); *H01L 2924/01004* (2013.01); *H01L 2924/0105* (2013.01); *H01L 2924/01006* (2013.01); *H01L 2924/01014* (2013.01); *H01L 2924/01026* (2013.01); *H01L 2924/01027* (2013.01); *H01L 2924/01028* (2013.01); *H01L 2924/01029* (2013.01); *H01L 2924/0132* (2013.01); *H01L 2924/0133* (2013.01); *H01L 2924/01033* (2013.01); *H01L 2924/0134* (2013.01); *H01L 2924/0135* (2013.01); *H01L 2924/01047* (2013.01); *H01L 2924/01049* (2013.01); *H01L 2924/01051* (2013.01); *H01L 2924/01078* (2013.01); *H01L 2924/01079* (2013.01); *H01L 2924/01082* (2013.01); *H01L 2924/01083* (2013.01); *H01L 2924/10253* (2013.01); *H01L 2924/14* (2013.01); *H01L 2924/15747* (2013.01); *H01L 2924/181* (2013.01); *H05K 3/3421* (2013.01); *H05K 2203/047* (2013.01)

(58) Field of Classification Search
USPC .......... 228/179.1, 180.21; 174/260; 420/557, 420/559–562
See application file for complete search history.

(56) References Cited

U.S. PATENT DOCUMENTS

| 6,267,823 | B1* | 7/2001 | Yamaguchi et al. | 148/24 |
| 7,105,383 | B2* | 9/2006 | Vo et al. | 438/124 |
| 7,932,587 | B2* | 4/2011 | Lehmann | 257/676 |
| 2002/0064903 | A1 | 5/2002 | Kawata et al. | |
| 2002/0155024 | A1* | 10/2002 | Hwang | 420/561 |
| 2003/0019216 | A1 | 1/2003 | Itakura et al. | |
| 2003/0021718 | A1* | 1/2003 | Munekata | B23K 1/0016 420/560 |
| 2006/0061974 | A1* | 3/2006 | Soga et al. | 361/743 |
| 2010/0270665 | A1 | 10/2010 | Lee et al. | |

FOREIGN PATENT DOCUMENTS

| JP | 2001-168519 A | 6/2001 |
| JP | 2001-284792 | 10/2001 |
| JP | 2001284792 A * | 10/2001 |
| JP | 2002-261104 | 9/2002 |
| JP | 2002-305213 A | 10/2002 |
| JP | 2002-368293 | 12/2002 |
| JP | 2004-34134 | 2/2004 |
| JP | 2005 340268 A | 12/2005 |
| JP | 2008 238253 A | 10/2008 |

OTHER PUBLICATIONS

International Search Report for PCT/JP2010/073849, dated Feb. 8, 2011.
Extended European Search Report prepared by the European Patent Office for EP 10841068.9, dated Aug. 3, 2016, 7 pages.
Notification of Rejection Reasons prepared by the Japanese Patent Office for JP 2013-272222, dated Sep. 30, 2014, 4 pages.
European Patent Office; Examination Report dated Nov. 28, 2017 for European Patent Application No. 10841068.9; 5 pages.
Korean Intellectual Property Office, Notice of Preliminary Rejection, dated Mar. 20, 2017, corresponding KR Patent Application No. 10-2016-7035344, 9 pgs.
Indian Patent Office; Examination Report dated Aug. 21, 2018 for Indian Patent App. No. 5746/DELNP/2012; 5 pages.
The American Heritage Dictionary of the English Language; Fifth Edition; copyright 2018 by Houghton Mifflin Harcourt Publishing Company; web page https://ahdictionary.com/word/search.html?q=fall+down.

* cited by examiner

METHOD FOR SOLDERING SURFACE-MOUNT COMPONENT AND SURFACE-MOUNT COMPONENT

This is a national stage application filed under 35 USC 371 based on International Application No. PCT/JP2010/073849 filed Dec. 22, 2010, and claims priority under 35 USC 119 of Japanese Patent Application No. JP 2009-298932 filed Dec. 28, 2009.

TECHNICAL FIELD

The present invention relates to a method for soldering surface-mount component by which the surface-mount component obtained by soldering a circuit element such as a semiconductor device (Si die/SiC die) on a die pad electrode portion using a die bonding solder material is soldered to a printed circuit board or the like using a mounting solder material, and the surface-mount component.

BACKGROUND ART

A package of semiconductor has been generally performed such that a circuit element is soldered to a die pad electrode portion (island portion) of a lead frame by die bonding and then, it is molded using resin. In a case of the circuit element such as a semiconductor device having large heat release, solder (hereinafter, referred to as "a solder material") has been used as brazing agents for the die bonding.

As the solder material, the solder material basically made of (Sn—Pb)-based solder material has been used in the past. Among them, the solder material made of almost (Sn—Pb of 5 percent by mass)-based solder material (hereinafter, a reference to an alloy will be carried out by deleting "percent by mass"), which has a relative high melting point of about 300 degrees C., has been used. This is because a heating condition of the solder material (a mounting solder material) when mounting the surface-mount component on the printed circuit board is from 240 to 260 degrees C., and they are heated for some seconds through 100 seconds so that the die-bonding solder material is required not to be melted.

When the circuit element operates, its temperature rises and when the circuit element does not operate, its temperature returns to the normal temperature thereof, so that any bonded portion by the solder material suffers a large temperature change. On the other hand, since the circuit element and the die pad electrode portion of the lead frame have different coefficient of thermal expansion from each other, the bonded portion by the solder material suffers any stresses repeatedly following the temperature changes based on the difference in the coefficient of thermal expansion. Fatigue based on this repeated stresses may cause cracks to occur in the bonded portions by the solder material. Accordingly, accompanying the crack extension, reliability of electric connection in the bonded portion by the solder material may deteriorate.

From these reasons, solder material in which metal, in minuscule quantities, such as Ag, In, Bi and/or Cu is contained in a composition of almost (Pb-5Sn) contains have recently been proposed.

However, if device having a very different coefficient of thermal expansion is bonded using these as the die-bonding solder material, a stress suffered to a bonded portion by the solder becomes too heavy so that a problem such that any remarkable improvement effect on heat cycle performance cannot be seen has been arisen.

In addition to this, any influence of Pb, which is contained in the (Sn—Pb)-based solder material, to a human body has recently been gotten popular, so that it has become a problem that a pollution of global environment or an influence to living things by a disposal of manufactured articles containing Pb should be reduced.

In order to reduce environmental pollution or the like, any lead-free solder material has been required. Accordingly, as the mounting solder material to be used when performing a surface mounting of surface-mount component onto a circuit board such as a printed circuit board, the lead-free (Pb-free) solder material has been recently used.

Further, until recently, as the die-bonding solder material, which is used when bonding a semiconductor device on a die pad electrode portion of a lead frame, solder material containing lead (for example, (Sn—Pb)-based solder material containing Pb of 85% or more by mass) has been used, but use of Pb-free solder material has been required even in the die-bonding solder material.

Here, in a case of solder material containing Pb of 85% or more by mass, they often have a solidus temperature of 260 degrees C. or more, which is a relatively high temperature, so that it has been conceivable that such a high temperature has exerted a bad influence upon the circuit element such as the semiconductor device. This is because a heating temperature to be used in a reflow furnace in this case is the solidus temperature (260 degrees C.) or more so that any soldering is performed under a condition such that any cracks occur in the bonded portion by the solder material or the die pad electrode portion or any exfoliation occurs in an interface between the lead frame and a mold.

From these points of view, as the die-bonding solder material to be used for bonding the circuit element on the lead frame, any studies by which Pb-free solder material having low melting temperature can be used have been carried out.

As the lead-free solder material having a lower solidus temperature than that of the solder material containing lead, (Sn—Ag)-based solder material, (Sn—Cu)-based solder material, (Sn—Sb)-based solder material and the like have been known. Among them, as the solder material having a high melting point and a higher solidus temperature than the heating temperature used in the reflow furnace, (Sn—Sb)-based solder material having high melting point has been known (see Patent Document 1).

In the (Sn—Sb)-based solder material having the high melting point, which is disclosed in Patent Document 1, its composition ratio is devised to prevent any voids or the like from occurring in a bonded portion by the solder material having the high melting point, which has been used at a period of die bonding time, even at a heating temperature when mounting a surface-mount component (IC package) on a printed circuit board.

PRIOR ART DOCUMENTS

Patent Document

Patent Document 1: Japanese Patent Application Publication No. 2001-284792

DISCLOSURE OF THE INVENTION

Problems to be Solved by the Invention

The solder material having high melting point, which is disclosed in Patent Document 1, however, particularly have high quantity of Sb constituent. Various kinds of experiments proved that when they have high quantity of Sb constituent, their solidus temperatures show a tendency to rise but, on the other hand, they are subject to cracks or the like so that mechanical reliability of the solder material shows a tendency to deteriorate.

In other words, when soldering the surface-mount component on a circuit board, heat is absorbed as internal latent heat by the die-bonding solder material or the like and thus, the heat is not fully conducted to the surface-mount component and/or the mounting solder material, so that a phenomenon in which heating is insufficient is ready to occur. As a result thereof, a wettability of the mounting solder material becomes poor, which causes any voids to occur to shake reliability thereof when mounting the surface-mount component on the circuit board.

The above-mentioned (Sn—Sb)-based solder material certainly has the solidus temperature which is lower than that of the solder material containing lead. However, since the solidus temperature is not particularly different from processing temperature (heating temperature) to be used in the reflow furnace, it is necessary to use solder material having a solidus temperature that is as low as possible, as the mounting solder material. At the same time, when using the (Sn—Sb)-based solder material, the following problems also have been raised.

When impurities such as Cu are contained in the (Sn—Sb)-based solder material, the solidus temperature of the solder material falls down by about 10 through 20 degrees C.

For example, the (Sn—Sb)-based solder material has the solidus temperature of 243 degrees C. while in the (Sn—Sb)-based solder material containing Cu, the solidus temperature thereof shows a tendency to fall down by about 10 degrees C.

Even when using Sn having a purity of 99.9% as Sn which is a main ingredient of the solder material, the remainder of 0.1% is impurity. Therefore, when the impurity contained therein is Cu, it is a matter of course that this may cause the solidus temperature thereof to fall down. JIS standard indicating the quantity of Cu constituent regulates 0.02% but it is known that even when Cu of about 0.02% is contained, the solidus temperature excessively falls down.

Similarly, in a step of soldering semiconductor device on a die pad electrode portion (bonded portion by the solder material) of the lead frame, Cu is under the environment in which Cu is subject to elution from the lead frame and mixture into the bonded solder material, which also causes the solidus temperature of the solder material to fall down.

For example, when the lead frame is made of Cu as its main ingredient, the lead frame is heated for a period of reflow soldering time, which causes the main ingredient of Cu to be eluted (by about 0.1 through 2% by mass) and to be mixed into the die-bonding solder material.

When Cu or the like is eluted in the molten die-bonding solder material, the same results as those of a case where the solder material containing Cu is used are caused, which causes the solidus temperature thereof to fall down.

If the solidus temperature thereof falls down, as described above, when soldering the surface-mount component on the circuit board, heat is absorbed by the die-bonding solder material and thus, the heat is not fully conducted to the surface-mount component and/or the mounting solder material, which causes a wettability of the mounting solder material to become poor and causes any voids to occur. Accordingly, since this deteriorates reliability thereof when mounting the surface-mount component on the circuit board, this is unsuitable for a relationship to the heating temperature of the reflow furnace.

Thus, these inventions solve such past problems and are a method for soldering surface-mount component and the surface-mount component in which the solder material which contains any component that causes the solidus temperature thereof to fall down very little or even when containing it, contains it below a previously fixed value thereof is used as the die-bonding solder material and any component that causes the solidus temperature thereof to fall down is prevented from being eluted in a step of bonding the solder material thereto.

Further, by soldering the surface-mount component using the die-bonding solder material and the mounting solder material, in which a difference between the solidus temperatures of the die-bonding solder material and the mounting solder material is made large, it is possible to prevent the die-bonding solder material from being melted.

Means for Solving the Problems

In order to solve the above-mentioned problems, a method for soldering a surface-mount component, which is claimed in Claim 1, according to this invention is characterized in that a surface-mount component formed by soldering a circuit element having an electrode surface on which a first Ni plating layer is formed onto a die pad electrode surface of a lead frame, a second Ni plating layer being formed on the die pad electrode surface, the soldering being done using (Sn—Sb)-based solder material which may contain Cb but not more than a predetermined quantity of Cu constituent, a main ingredient of the (Sn—Sb)-based solder material being Sn, is soldered onto a board terminal portion of a circuit board using (Sn—Ag—Cu—Bi)-based solder material as the mounting solder material with the (Sn—Ag—Cu—Bi)-based solder material being applied on the terminal portion.

Further, a surface-mount component, which is claimed in Claim 9, according to this invention is characterized in that the surface-mount component comprises a lead frame including a die pad electrode portion on which a circuit element is mounted and a lead portion bonded to a circuit board, Ni plating layer being formed on the die pad electrode surface, the circuit element which is bonded to the die pad electrode portion through (Sn—Sb)-based solder material with Ni plating layer being its bonded surface, the (Sn—Sb)-based solder material containing Cu not more than a predetermined quantity of Cu constituent and a main ingredient thereof being Sn, and the circuit board in which the lead portion is bonded to a land portion constituting a board terminal portion through (Sn—Ag—Cu—Bi)-based solder material or (Sn—Ag—Cu—Bi—In)-based solder material.

In these inventions, as the die-bonding solder material, the (Sn—Sb)-based solder material is used.

The quantity of Cu constituent in the (Sn—Sb)-based solder material to be used is limited so as to be not more than the predetermined quantity of Cu constituent. The predetermined quantity of Cu constituent is 0.01% by mass or less, preferably, 0.005% by mass or less. When the quantity of Cu constituent is not more than the predetermined quantity thereof, it was verified that the lowering of the solidus temperature could be avoided.

Since the lead frame has Cu as a main ingredient thereof, the die pad electrode portion (island portion that is a bonded surface by the solder material) that is a circuit element fixing surface on which the circuit element is mounted and fixed is plated and used. Particularly, the lead frame, the die pad electrode portion of which is plated by Ni, is used. Ni plating layer prevents Cu component from being eluted when the bonding is performed using the solder material. At the same time, Ni plating layer is also formed on an electrode surface side of the circuit element.

Thus, even when the circuit element is bonded to the lead frame using the solder material with the circuit element being mounted on the lead frame, any elution of Cu component stops, thereby avoiding the lowering of the solidus temperature.

As the mounting solder material, the (Sn—Ag—Cu—Bi)-based solder material or the (Sn—Ag—Cu—Bi—In)-based solder material is used. By selecting the composition ratio thereof so as to become any given ones, a temperature indicating a maximum endothermic reaction (maximum endothermic reaction temperature) is 215 degrees C. or less in the (Sn—Ag—Cu—Bi)-based solder material (see Table 4) or is 210 degrees C. or less in the (Sn—Ag—Cu—Bi—In)-based solder material (see Table 5). As a result thereof, a minimum heating temperature on which the soldering can be carried out in the reflow furnace decreases as compared with the prior art. It is to be noted that as a method of measuring the maximum endothermic reaction temperature, differential scanning calorimetry (DSC) measurement was adapted.

Since the solidus temperature of the (Sn—Sb)-based solder material itself to be used as the die-bonding solder material is 245 degrees C., when using the above-mentioned mounting solder material, a difference between the solidus temperatures of the die-bonding solder material and the mounting solder material expands. As a result thereof, solderability on the bonded portion by the solder material of all the surface-mount components mounted is improved so that even if a temperature profile in the circuit board enlarges, the die-bonding solder material is not melted.

Effects of the Invention

According to these inventions, the solidus temperature can fall down as compared with the past one and the primary solidus temperature of the (Sn—Sb)-based solder material can be held as it is, thereby consequently allowing any influence of the heating temperature to circuit elements to be avoided.

Further, by using as the mounting solder material the (Sn—Ag—Cu—Bi)-based solder material or the (Sn—Ag—Cu—Bi—In)-based solder material, which have low solidus temperatures, it is possible to lower the minimum heating temperature of the reflow furnace on which the soldering can be carried out (reflowable minimal temperature) as compared with the past one and to expand the difference between the solidus temperatures of it and the die-bonding solder material.

As a result thereof, since the solderability on the bonded portion by the solder material of all the surface mount devices mounted is improved so that even if a temperature profile in the circuit board enlarges, the die-bonding solder material is not melted, thereby allowing a bonding strength of the surface-mount component and its mechanical reliability to be enhanced.

BEST MODE FOR CARRYING OUT THE INVENTION

The following will describe embodiments according to the present inventions with reference to drawings. In the following executed examples, a case where a semiconductor device (IC chip) cut from a wafer as a circuit element is available in a surface mount configuration will be described. Accordingly, a printed circuit board is used as the circuit board.

Executed Example 1

First, a method of soldering a surface-mount component will be described with reference to FIGS. 1A through 1E but the outline explanation thereof will be described because this soldering step itself is well known one.

Figure 1A:
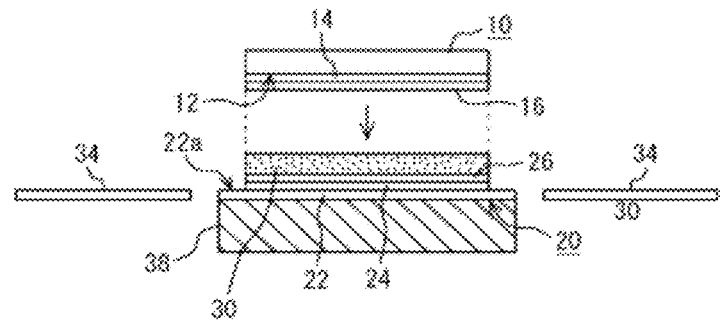
FIG. 1A is a diagram showing an outline step when performing die bonding of IC chip.

As shown in FIG. 1A, in the inventions, Ni plating layer 14 is formed on an electrode surface 12 constituting a die bonding surface in a semiconductor device (IC chip) 10. The Ni plating layer 14 is formed on the whole area of a die bonding surface (the whole electrode surface). Sn plating layer or Au plating layer 16 is further formed on a top of the Ni plating layer 14. The Au plating layer 16 is formed, if necessary.

The Sn plating layer or Au plating layer 16 may be formed on a side thereof to be soldered by the die-bonding solder material 30 (a top surface thereof) in this state, and any layer such as Cu layer or Ti layer other than Ni plating layer may lie between the IC chip 10 and the Ni plating layer 14.

As shown in FIG. 1A, a die pad electrode portion (die bonding bonded portion) 22 constituting an island portion of a lead frame 20 is a circuit element fixing portion. To a lower surface thereof, a heat sink plate 38 is attached and an upper surface 22a thereof is a die pad electrode surface. Accordingly, the die pad electrode surface 22a functions as an electrode surface for fixing the circuit element.

Ni plating layer 24 is formed on the die pad electrode surface 22a opposing the electrode surface 12 of the IC chip 10. Au plating layer 26 is further formed on a top layer of the Ni plating layer 24. The Au plating layer 26 is formed, if necessary.

The die-bonding solder material 30 is then supplied onto the top layer of the die pad electrode surface 22a. In this example, since the Au plating layer 26 is formed on the top layer thereof, the die-bonding solder material 30 is applied to an upper layer of the Au plating layer 26 (solder paste processing). As the die-bonding solder material 30, the solder material having high melting point, which will be described later, is used.

Here, since the lead frame 20 has a main ingredient of Cu, in this invention, Ni plating layer 24 covers the die pad electrode surface 22*a* of the lead frame 20.

Covering of the Ni plating layer 24 makes it difficult to elute Cu even if the lead frame 20 is heated during a soldering step of IC chip 10 to elute Cu and prevents Cu, if Cu is eluted, from being mixed into the die-bonding solder material 30.

When the eluted Cu is mixed into the die-bonding solder material 30, the solidus temperature (in this example, 245 degrees C., which will be described later) of this die-bonding solder material 30 itself falls down. An experiment verified that they fell down to about 229 through 236 degrees C. Using the Ni plating plate 24 enables the solidus temperature of the die-bonding solder material 30 itself to be kept on 245 degrees C.

Figure 1B:
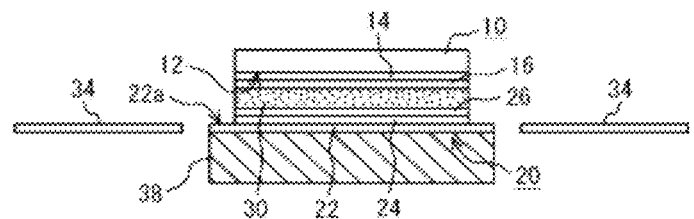
FIG. 1B is a diagram showing an outline step when performing the die bonding of IC chip.

As shown in FIG. 1B, the electrode surface 12 of the IC chip 10 is mounted and provisionally fixed on a surface of the attached die-bonding solder material 30 which has a high melting point so as to be faced to each other. They then are conveyed into an oven reflow furnace (not shown) and are subjected to any heating process. By this heating process, Au plating layers 16 and 26 are melted as shown in FIG. 1C.

Figure 1C:
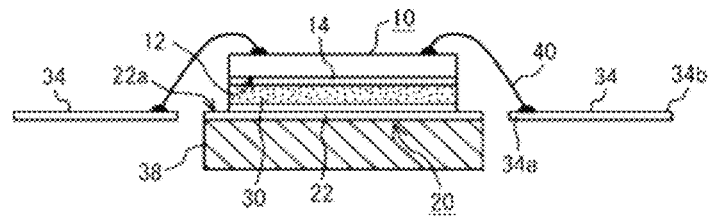
FIG. 1C is a diagram showing an outline step when performing the die bonding of IC chip.
Figure 1D:
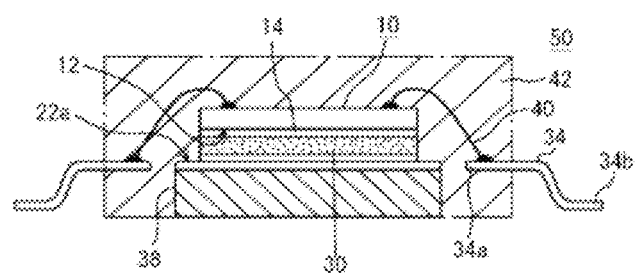
FIG. 1D is a diagram showing an outline step when performing the die bonding of IC chip.

When soldering it on the die pad electrode surface 22*a* using the die-bonding solder material 30, the circuit element shown in FIG. 1C is completed. In fact, Inner terminal portions (internal electrode portions) 34*a* of leads 34 and the IC chip 10, which constitute this circuit element, are bonded (using wire bonding) by electrode wires 40 and then the IC chip 10 and the lead frame 20, which have been bonded using the wire bonding, are molded by resin 42 to obtain a well-known surface-mount component 50 shown in FIG. 1D.

As the surface-mount component 50, small outline package (SOP), quad flat non-lead (QFN), quad flat package (QFP) and the like are conceivable.

Figure 1E:
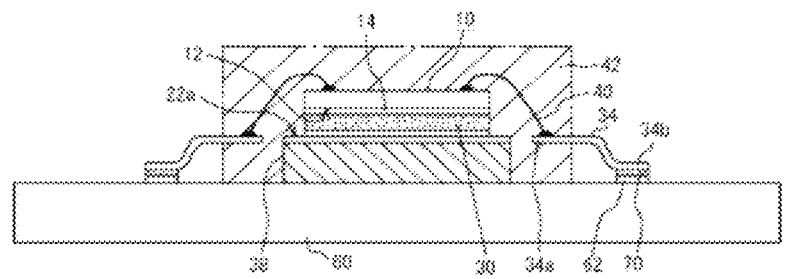
FIG. 1E is a diagram showing an outline step when performing the die bonding of IC chip.

The surface-mount component 50 is mounted on the printed circuit board 60 functioning as the circuit board, as shown in FIG. 1E. Accordingly, a board terminal portion (land) 62 formed on the printed circuit board 60 and outer terminal portions 34*b* of the leads 34 are soldered using Pb-free mounting solder material 70 to complete the mounting process.

It is to be noted that plating with Sn, Sn—Bi, Sn—Cu, Sn—Ag and the like is previously conducted throughout the leads 34 constituting the lead frame 20.

The above-mentioned mounting process is carried out in the oven reflow furnace. As the mounting solder material 70, the solder material having lower solidus and liquidus temperatures than those of (Sn—Ag—Cu)-based solder material which has been used in the past, is used, which will be described later.

The following will describe the die-bonding solder material 30 and the mounting solder material 70, which are used in the inventions.

In the inventions, as the die-bonding solder material 30, the solder material which contains any component that causes the solidus temperature thereof to fall down very little or even when containing it, contain it below a previously fixed value thereof are used and any component that causes the solidus temperature thereof to fall down is prevented from being eluted in a step of bonding the solder material thereto.

The surface-mount component is soldered using the die-bonding solder material 30 and the mounting solder material 70, in which a difference between the solidus temperatures of the die-bonding solder material 30 and the mounting solder material 70 is expanded. The following will be described with reference to Table 1.

TABLE 1

1.

| | Die-Bonding Solder Material | | | Die Bonding Bonded Portion | | | |
|---|---|---|---|---|---|---|---|
| Composition | Solidus Temp. (° C.) | Liquidus Temp. (° C.) | Melting Rate Under 245° C. (%) | Electrode | Solidus Temp. (° C.) | Liquidus Temp. (° C.) | Melting Late Under 245° C. (%) |
| Sn—10Sb | 245 | 268 | 12 | Ag Plating | 229 | 261 | 50% or More |
| Sn—10Sb | 245 | 268 | 12 | Cu | 236 | 268 | 50% or More |
| Sn—10Sb | 245 | 268 | 12 | Ni Plating | 245 | 268 | 12 |
| Sn—10Sb—0.1Cu | 236 | 268 | 47 | Cu | 236 | 268 | 50% or More |
| Sn—10Sb—0.1Cu | 236 | 268 | 47 | Ni Plating | 239 | 268 | 47 |
| Sn—10Sb—0.05Cu | 239 | 268 | 27.5 | Ni Plating | 239 | 268 | 27.5 |
| Sn—10Sb—0.02Cu | 239 | 268 | 18 | Ni Plating | 239 | 268 | 18 |
| Sn—10Sb—0.001Cu | 245 | 268 | 12 | Cu | 236 | 268 | 50% or More |
| Sn—10Sb—0.01Cu | 245 | 268 | 15 | Ni Plating | 239 | 268 | 15 |
| Sn—10Sb—0.005Cu | 245 | 268 | 13.5 | Ni Plating | 245 | 268 | 13.5 |
| Sn—10Sb—0.001Cu | 245 | 268 | 12 | Ni Plating | 245 | 268 | 12 |

| | | Melting of Die-Bonding Solder Material | | | | |
|---|---|---|---|---|---|---|
| | Reflowable | Reflow Temp., 250° C. | | Reflow Temp., 255° C. | | |
| Die-Bonding Solder Material Composition | Smallest Temp. | Melting Rate (%) | Success or Failure | Melting Rate (%) | Success or Failure | |
| Sn—10Sb | 230° C. | 50% or More | Failure | 50% or More | Failure | |
| Sn—10Sb | 230° C. | 50% or More | Failure | 50% or More | Failure | |
| Sn—10Sb | 230° C. | 50% or More | Failure | 50% or More | Failure | |
| Sn—10Sb—0.1Cu | 230° C. | 50% or More | Failure | 50% or More | Failure | |
| Sn—10Sb—0.1Cu | 230° C. | 50% or More | Failure | 50% or More | Failure | |

TABLE 1-continued

| 1. | | | | | | |
|---|---|---|---|---|---|---|
| Sn—10Sb—0.05Cu | 230° C. | 50% or More | Failure | 50% or More | Failure |
| Sn—10Sb—0.02Cu | 230° C. | 50% or More | Failure | 50% or More | Failure |
| Sn—10Sb—0.001Cu | 230° C. | 50% or More | Failure | 50% or More | Failure |
| Sn—10Sb—0.01Cu | 230° C. | 50% or More | Failure | 50% or More | Failure |
| Sn—10Sb—0.005Cu | 230° C. | 50% or More | Failure | 50% or More | Failure |
| Sn—10Sb—0.001Cu | 230° C. | 50% or More | Failure | 50% or More | Failure |

<Mounting Solder Material: M705>

Table 1 shows unsuitable examples in order to compare them with those of the inventions. As the mounting solder material 70, (Sn-3Ag-0.5Cu)-based alloy solder material of M705 specification which has been used in the past are exemplified. The solidus temperature thereof is 217 degrees C. and the liquidus temperature thereof is 220 degrees C.

On the other hand, as the die-bonding solder material 30, (Sn—Sb)-based solder material which has a main ingredient of Sn as shown in Table 1 is used.

In Table 1, as the (Sn—Sb)-based solder material, two species of the solder materials, which contain Cu and no Cu, are shown. The (Sn-10Sb)-based solder material contains any impurities of 0.1% by mass or less. The solidus temperature of the (Sn-10Sb)-based solder material itself is 245 degrees C. and the liquidus temperature thereof is 268 degrees C.

Table 1 shows composition ratios of the die-bonding solder material 30, the solidus and liquidus temperatures and melting rate of the die-bonding solder material 30 itself under 245 degrees C., on these composition ratios. Further, the solidus and liquidus temperatures and melting rate thereof under 245 degrees C., on the die pad electrode portion 22 which is a bonded portion, show experimented values with a case where the die pad electrode portion 22 is not plated and a case where the die pad electrode portion 22 is plated being separated from each other.

When changing the heating temperature of the reflow furnace, how the melting state in the die pad electrode portion 22 does change is indicated by success or failure (suitability or unsuitability). Here, on the success or failure of melting of the die-bonding solder material 30 in the die pad electrode portion 22, it was decided as the failure when even 1% by mass thereof is melted.

The minimum heating temperature of the reflow furnace (reflowable minimal temperature) was set so as to become a higher temperature by about 10 degrees C. than the liquidus temperature of the mounting solder material 70 and success or failure was verified by the experiments at the heating temperatures higher than the reflowable minimal temperature by 20 and 25 degrees C.

As Table 1, in cases of (Sn-10Sb)-based solder material, the melting rates of the die-bonding solder material 30 itself under 245 degrees C. was 12%. In cases where Sb of 10% by mass or less was contained, as shown in Table 1, the solidus temperatures of the die pad electrode portions 22 fell down to 245 degrees C. or less. These values were changed by the plating layers on the die pad electrode portions 22 but they were lower than the solidus temperature of the die-bonding solder material 30 itself.

In conclusion, in a case of (Sn-10Sb)-based solder material, even when adjusting the quantity of a constituent of Cu contained in the die-bonding solder material 30, it was verified that a melting occurred in the die pad electrode portions 22. Therefore, the solder materials shown in Table 1 are not approved so as to be suitable combinations.

TABLE 2

| 2. | | | | | | | |
|---|---|---|---|---|---|---|---|
| Die-Bonding Solder Material | | | | Die Bonding Bonded Portion | | | |
| Composition | Solidus Temp. (° C.) | Liquidus Temp. (° C.) | Melting Rate Under 245° C. (%) | Electrode | Solidus Temp. (° C.) | Liquidus Temp. (° C.) | Melting Late Under 245° C. (%) |
| Sn—10Sb | 245 | 268 | 12 | Ag Plating | 229 | 261 | 50% or More |
| Sn—10Sb | 245 | 268 | 12 | Cu | 236 | 268 | 50% or More |
| Sn—10Sb | 245 | 268 | 12 | Ni Plating | 239 | 268 | 12 |
| Sn—10Sb—0.1Cu | 236 | 268 | 47 | Cu | 245 | 268 | 50% or More |
| Sn—10Sb—0.1Cu | 236 | 268 | 47 | Ni Plating | 239 | 268 | 47 |
| Sn—10Sb—0.05Cu | 239 | 268 | 27.5 | Ni Plating | 239 | 268 | 27.5 |
| Sn—10Sb—0.02Cu | 239 | 268 | 18 | Ni Plating | 239 | 268 | 18 |
| Sn—10Sb—0.001Cu | 245 | 268 | 12 | Cu | 236 | 268 | 50% or More |
| Sn—10Sb—0.01Cu | 245 | 268 | 15 | Ni Plating | 245 | 268 | 15 |
| Sn—10Sb—0.005Cu | 245 | 268 | 13.5 | Ni Plating | 245 | 268 | 13.5 |
| Sn—10Sb—0.001Cu | 245 | 268 | 12 | Ni Plating | 245 | 268 | 12 |

| | | Melting of Die-Bonding Solder Material | | | |
|---|---|---|---|---|---|
| | Reflowable | Reflow Temp., 240° C. | | Reflow Temp., 245° C. | |
| Die-Bonding Solder Material Composition | Smallest Temp. | Melting Rate (%) | Success or Failure | Melting Rate (%) | Success or Failure |
| Sn—10Sb | 220° C. | 50% or More | Failure | 50% or More | Failure |
| Sn—10Sb | 220° C. | 30% | Failure | 50% or More | Failure |
| Sn—10Sb | 220° C. | 0 | Success | 12 | Failure |

TABLE 2-continued

| 2. | | | | | | |
|---|---|---|---|---|---|---|
| Sn—10Sb—0.1Cu | 220° C. | 30% | Failure | 50% or More | Failure |
| Sn—10Sb—0.1Cu | 220° C. | 7.5 | Failure | 47 | Failure |
| Sn—10Sb—0.05Cu | 220° C. | 4% | Failure | 27.5 | Failure |
| Sn—10Sb—0.02Cu | 220° C. | 1 | Failure | 18 | Failure |
| Sn—10Sb—0.001Cu | 220° C. | 30% | Failure | 50% or More | Failure |
| Sn—10Sb—0.01Cu | 220° C. | 0 | Success | 15 | Failure |
| Sn—10Sb—0.005Cu | 220° C. | 0 | Success | 13.5 | Failure |
| Sn—10Sb—0.001Cu | 220° C. | 0 | Success | 12 | Failure |

<Mounting Solder Material: Sn—Ag—Cu—Bi>

Table 2 shows the experiments for presenting an explanation of the inventions.

In Table 2, there shows a case where as the die-bonding solder material 30, (Sn-10Sb)-based solder material was used and as the mounting solder material 70, (Sn—Ag—Cu—Bi)-based soldering material was used.

When Sb of 10% by mass or less was contained in the die-bonding solder material 30, it did not satisfy 245 degrees C. as the solidus temperature thereof, and its solidus temperature was 245 degrees C. or less. On the other hand, when Sb of 13% by mass or more was contained, the solder material is made hard so that it was subject to cracks, thereby causing the mechanical reliability of the solder material after the solidification thereof to deteriorate. Therefore, Sb of 10 through 13% by mass is preferably contained and in order to prevent any cracks from occurring and maintain the mechanical reliability, Sb of 10 through 11% by mass is preferably contained.

Further, a purity of Sn which is a main ingredient of the solder material is preferably 99.9% by mass or more, particularly, the quantity of a constituent of Cu contained in the impurities of 0.1% by mass is preferably 0.01% by mass or less, further preferably, 0.005% by mass or less. This is because when the percentage of a constituent of Cu is increased, the natural solidus temperature (245 degrees C.) fall down to that extent.

As the (Sn—Ag—Cu—Bi)-based solder material used as the mounting solder material, the solder material containing Ag of 3 through 3.4% by mass, Cu of 0.5 through 1.1% by mass, Bi of 3 through 7% by mass and the remainder of Sn is shown. When an addition of Ag is increased, there is a suspicious that the solidus temperature rises. Therefore, it is preferably about 3.0% by mass.

Since Cu also causes the solidus temperature to fall, its addition within a range of 0.55 through 0.85% by mass is preferable. Since Bi also causes the solidus temperature to fall, which is similar to Cu, and causes the mechanical strength to deteriorate, it is preferably added within a range of 3 through 5% by mass. In this example, (Sn-3Ag-0.8Cu-3Bi)-based solder material was used.

When using the (Sn—Ag—Cu—Bi)-based mounting solder material 70, to which Bi is added, the solidus temperature thereof is 205 degrees C. and the liquidus temperature thereof is 215 degrees C. so that these solidus and liquidus temperatures can be made lower than those of the solder material of M705 specification.

On the other hand, as shown in Table 2, these solidus and liquidus temperatures of the die-bonding solder material 30 itself were respectively unchanged by adding Cu and when the plating material of the die pad electrode portion 22 was Ni, the melting rates of the die pad electrode portion 22 under 245 degrees C. were about 12 through 15%. When, however, the temperature of the reflow furnace was within a range of 220 through 240 degrees C., the melting rates of the die pad electrode portion 22 under 245 degrees C. were made 0%.

Here, setting of the smallest reflow furnace temperature so as to be 220 degrees C. is because the liquidus temperature when using the mounting solder material 70 which has the above-mentioned composition ratios is 215 degrees C. which is low. It is to be noted that when the temperature of the reflow furnace smallest temperature rises up to 245 degrees C., the melting rate in the die pad electrode portions 22 under 245 degrees C. becomes 12 through 15%.

As a result thereof, when using the lead frame 20 with Ni plating layer on the die pad electrode surface 22a, using the (Sn—Ag—Cu—Bi)-based solder material as the mounting solder material 70, and using (Sn-10Sb)-based solder material as the mounting solder material 30 in which the quantity of a constituent of Cu contained in the impurities of 0.1% by mass or less is limited so as to be 0.01% by mass or less, satisfactory results are given when the heating temperature of the reflow furnace is up to 240 degrees C.

Here, the die-bonding solder material 30 in the die pad electrode portions 22 was determined so as to be failure even if 1% thereof was melted, which was similar to the case of Table 1.

For caution's sake, the (Sn-10Sb)-based solder materials, which have been used in the past, are still shown in Table 2. Further, combinations in which Cu of 0.02% by mass or more is contained are also shown therein as comparison examples.

TABLE 3

| 3. | | | | | | | |
|---|---|---|---|---|---|---|---|
| Die-Bonding Solder Material | | | | Die Bonding Bonded Portion | | | |
| Composition | Solidus Temp. (° C.) | Liquidus Temp. (° C.) | Melting Rate Under 245° C. (%) | Electrode | Solidus Temp. (° C.) | Liquidus Temp. (° C.) | Melting Rate Under 245° C. (%) |
| Sn—10Sb | 245 | 268 | 12 | Ag Plating | 229 | 261 | 50% or More |
| Sn—10Sb | 245 | 268 | 12 | Cu | 236 | 268 | 50% or More |
| Sn—10Sb | 245 | 268 | 12 | Ni Plating | 245 | 268 | 12 |
| Sn—10Sb—0.1Cu | 236 | 268 | 47 | Cu | 236 | 268 | 50% or More |

TABLE 3-continued

3.

| | | | | | | | |
|---|---|---|---|---|---|---|---|
| Sn—10Sb—0.1Cu | 236 | 268 | 47 | Ni Plating | 239 | 268 | 47 |
| Sn—10Sb—0.05Cu | 239 | 268 | 27.5 | Ni Plating | 239 | 268 | 27.5 |
| Sn—10Sb—0.02Cu | 239 | 268 | 18 | Ni Plating | 239 | 268 | 18 |
| Sn—10Sb—0.001Cu | 245 | 268 | 12 | Cu | 236 | 268 | 50% or More |
| Sn—10Sb—0.01Cu | 245 | 268 | 15 | Ni Plating | 239 | 268 | 15 |
| Sn—10Sb—0.005Cu | 245 | 268 | 13.5 | Ni Plating | 245 | 268 | 13.5 |
| Sn—10Sb—0.001Cu | 245 | 268 | 12 | Ni Plating | 245 | 268 | 12 |

| | | Melting of Die-Bonding Solder Material | | | | |
|---|---|---|---|---|---|---|
| | Reflowable | Reflow Temp., 235° C. | | Reflow Temp., 240° C. | |
| Die-Bonding Solder Material Composition | Smallest Temp. | Melting Rate (%) | Success or Failure | Melting Rate (%) | Success or Failure |
| Sn—10Sb | 215° C. | 50% or More | Failure | 50% or More | Failure |
| Sn—10Sb | 215° C. | 0 | Success | 30% | Failure |
| Sn—10Sb | 215° C. | 0 | Success | 0 | Success |
| Sn—10Sb—0.1Cu | 215° C. | 0 | Success | 30% | Failure |
| Sn—10Sb—0.1Cu | 215° C. | 0 | Success | 7.5 | Failure |
| Sn—10Sb—0.05Cu | 215° C. | 0 | Success | 4% | Failure |
| Sn—10Sb—0.02Cu | 215° C. | 0 | Success | 1 | Failure |
| Sn—10Sb—0.001Cu | 215° C. | 0 | Success | 30% | Failure |
| Sn—10Sb—0.01Cu | 215° C. | 0 | Success | 0 | Success |
| Sn—10Sb—0.005Cu | 215° C. | 0 | Success | 0 | Success |
| Sn—10Sb—0.001Cu | 215° C. | 0 | Success | 0 | Success |

<Mounting Solder Material: Sn—Ag—Cu—Bi—In>

Table 3 shows a preferable embodiment of this invention.

The embodiment of Table 3 is a case where (Sn—Ag—Cu—Bi—In)-based solder material was used in which In is added to the components shown in Table 2 as the mounting solder material 70.

When Bi is within a range of 2 through 5% by mass, In of 3 through 5% by mass is added. The suitable addition is such that when Bi is 3% by mass, In is 3 through 4% by mass; When Bi is 4% by mass, In is preferably 3% by mass. In acts so that the liquidus temperature falls down. In this embodiment, (Sn-3Ag-0.8Cu-2Bi-5In)-based solder material was used.

When using (Sn-3Ag-0.5Cu-3Bi-3In)-based solder material, into which In is further added, as the mounting solder material 70, the solidus temperature thereof was 189 degrees C. and the liquidus temperature thereof was 210 degrees C., which allowed them to further fall down than those of a case of addition of Bi. Of course, both of the solidus temperature thereof and the liquidus temperature thereof can fall down below those of the solder material of M705 specification.

The die-bonding solder material 30 is (Sn—10Sb)-based solder material, in which the quantity of a constituent of Cu contained in the impurities of 0.1% by mass or less is 0.01% by mass or less, which is similar to those of Table 2. For caution's sake, data of the die-bonding solder material 30 which contains Cu of 0.02% by mass or more are shown therein, which is similar to Table 2.

Containing Cu did not cause the solidus temperature and the liquidus temperature of the die-bonding solder material 30 to be changed, which were respectively 245 degrees C. and 268 degrees C., and this was similar to those of Table 2.

As the plating material of the die pad electrode portion 22 composed of Cu material, Ni material is most preferable.

The solidus temperatures in the die pad electrode portion 22, the quantity of a constituent of Cu of which is 0.01% by mass or less, were the solidus temperature of 239 through 245 degrees C., which were the same as the solidus temperature (245 degrees C.) of the die-bonding solder material 30 itself or were very close to it. The liquidus temperatures in the die pad electrode portion 22 were remained unchanged, 268 degrees C.

The melting rates of the die-bonding solder material 30 under 245 degrees C. were within a range of about 12 through about 27.5% when the quantity of a constituent of Cu was 0.01% by mass or less. By the way, when using the conventional die-bonding solder material 30 which includes a case where Cu of 0.02% by mass or more is contained, the melting rate is 50% or more.

On the other hand, since when (Sn—Ag—Cu—Bi—In)-based solder material is used as the mounting solder material 70, the liquidus temperature falls down to 210 degrees C. as described above, the minimum temperature of the reflow furnace (the smallest heating temperature) falls down so that the reflowable minimal temperature can be set to be almost 215 degrees C. Accordingly, even if temperature in the reflow furnace rises up to 230 through 235 degrees C., the experiments verified that a die-bonding solder material 30 was not melted in the die pad electrode portion 22 as shown in Table 3.

Next, executed examples (experiments) when changing composition ratios of the mounting solder material 70 are shown in Tables 4 and 5. This was a case where as the die-bonding solder material 30, (Sn—10Sb)-based solder material was used.

TABLE 4

Figure 3:
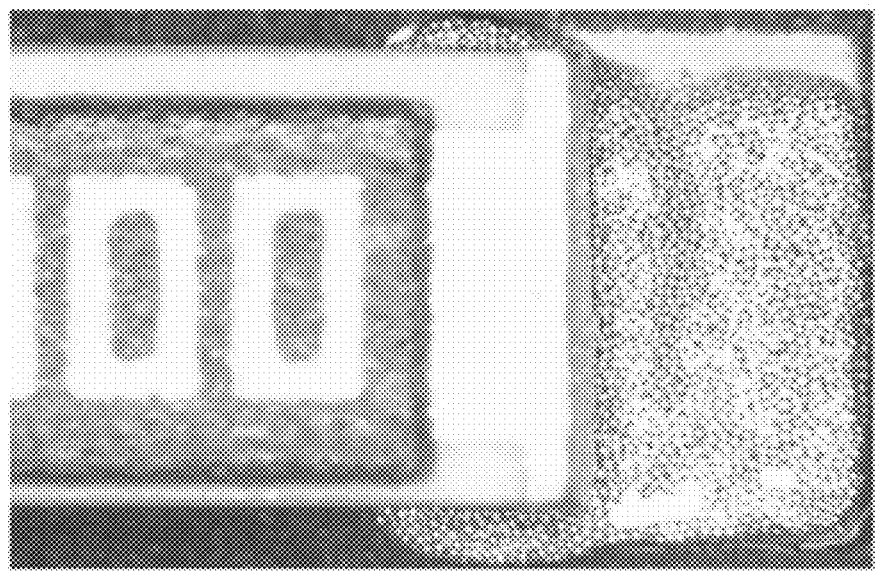
FIG. 3 is a photograph in which a part of FIG. 2 is further enlarged.
Figure 4:
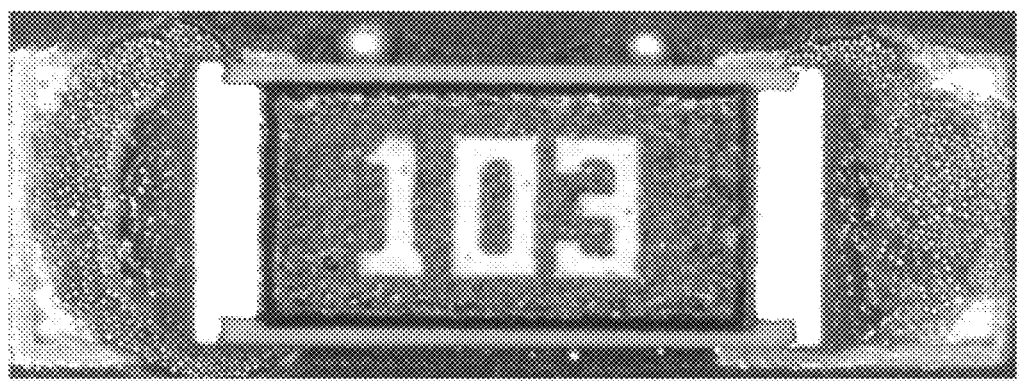
FIG. 4 is an enlarged photograph showing an imperfect fused condition of the solder material based on an insufficient heating.
Figure 6:
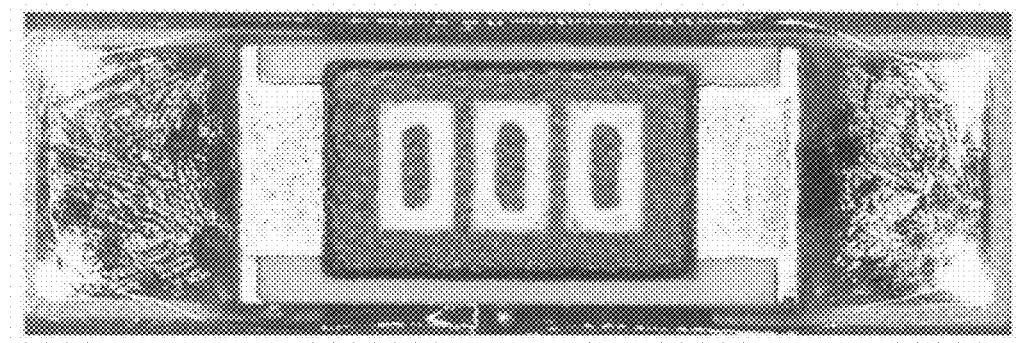
FIG. 6 is an enlarged photograph showing a perfect fused condition of the solder material according to these inventions.

| | Composition (% by Mass) | | | | Melting Point (° C.) | | | Bonding Strength (N) After Heat Cycle Test After 1000 Cycles | | Surface Condition of Solder Materials |
|---|---|---|---|---|---|---|---|---|---|---|
| | Sn | Bi | Ag | Cu | Solidus Temp. | Maximum Endothermal Reaction Point Temp. | Liquidus Temp. | Average Value | Minimum Value | |
| Executed Example 1 | Remainder | 3 | 3.3 | 0.9 | 205 | 215 | 215 | 62 | 44 | FIG. 6 |
| Executed Example 2 | Remainder | 4 | 3.3 | 0.8 | 202 | 213 | 213 | 90 | 58 | FIG. 6 |
| Executed Example 3 | Remainder | 5 | 3.3 | 0.8 | 188 | 212 | 212 | 95 | 75 | FIG. 6 |
| Executed Example 4 | Remainder | 6 | 3.3 | 0.9 | 184 | 211 | 211 | 95 | 58 | FIG. 6 |
| Executed Example 5 | Remainder | 4 | 3 | 1.0 | 199 | 213 | 230 | 88 | 42 | FIG. 6 |
| Executed Example 6 | Remainder | 5 | 3 | 1.0 | 188 | 211 | 230 | 85 | 49 | FIG. 6 |
| Executed Example 7 | Remainder | 3 | 3 | 1.0 0.03Ni | 199 | 214 | 214 | 77 | 45 | FIG. 6 |
| Executed Example 8 | Remainder | 5 | 3 | 0.5 0.01Co | 199 | 212 | 212 | 95 | 60 | FIG. 6 |
| Executed Example 9 | Remainder | 3 | 3 | 0.8 0.005Fe | 188 | 214 | 212 | 72 | 40 | FIG. 6 |
| Executed Example 10 | Remainder | 5 | 3 | | 190 | 214 | 214 | 68 | 33 | FIG. 6 |
| Executed Example 11 | Remainder | 4 | 3 | | 196 | 215 | 215 | 41 | 25 | FIG. 6 |
| Executed Example 12 | Remainder | 5 | 3 | 0.1Ni | 190 | 214 | 214 | 63 | 38 | FIG. 6 |
| Executed Example 13 | Remainder | 4 | 3 | 0.1Co | 196 | 215 | 215 | 47 | 31 | FIG. 6 |
| Executed Example 14 | Remainder | 5 | 3 | 0.1Ni, 0.05Co | 190 | 214 | 214 | 68 | 41 | FIG. 6 |
| Executed Example 15 | Remainder | 5 | 3 | 0.3Ni | 190 | 214 | 250 | 60 | 18 | FIG. 6 |
| Executed Example 16 | Remainder | 5 | 3 | 0.2Co | 190 | 214 | 320 | 41 | 15 | FIG. 6 |
| Comparison Example 1 | Remainder | 0 | 3 | 0.5 | 217 | 220 | 220 | 30 | 18 | FIG. 3 |
| Comparison Example 2 | Remainder | 0 | 3 | 0.5 | 217 | 220 | 220 | 25 | 5 | FIG. 4 |
| Comparison Example 3 | Remainder | 1 | 3.3 | 0.9 | 204 | 216 | 216 | 30 | 10 | FIG. 4 |
| Comparison Example 4 | Remainder | 2 | 3.3 | 0.9 | 202 | 215 | 215 | 38 | 13 | FIG. 4 |
| Comparison Example 5 | Remainder | 1.5 | 4 | 1.0 | 204 | 216 | 231 | 31 | 10 | FIG. 4 |
| Comparison Example 6 | Remainder | 8 | 3 | 0.8 | 174 | 209 | 230 | 85 | 19 | FIG. 4 |

Table 4 shows executed examples when using (Sn—Ag—Cu—Bi)-based solder material. The executed examples 1 through 6 are executed examples in which (Sn—Ag—Cu—Bi)-based solder material is used and the executed examples 7 through 9 are executed examples in which a specified metal (one species of Ni, Fe and Co) is added thereto. The executed examples 10 and 11 are executed examples in which the solder material containing no Cu is used and the executed examples 12 through 16 are executed examples in which specified metal (any one or both of Ni and Co) is/are added thereto.

The comparison example 1 was data when using the solder material of M705 specification. They were used as reference data.

Table 4 shows composition ratios of the solder material. Table 4 also shows a melting point at the maximum endothermal reaction point in addition to the solidus temperature and the liquidus temperature as the melting points. It further shows mechanical bonding strength and good or bad of a surface condition of the solder material. As the heating temperature of the reflow furnace, 220 degrees C. are exemplified in the executed examples 1 through 9; 230 degrees C. are exemplified in the comparison example 1; and 220 degrees C. are exemplified in the comparison examples 2 through 6.

Figure 2:
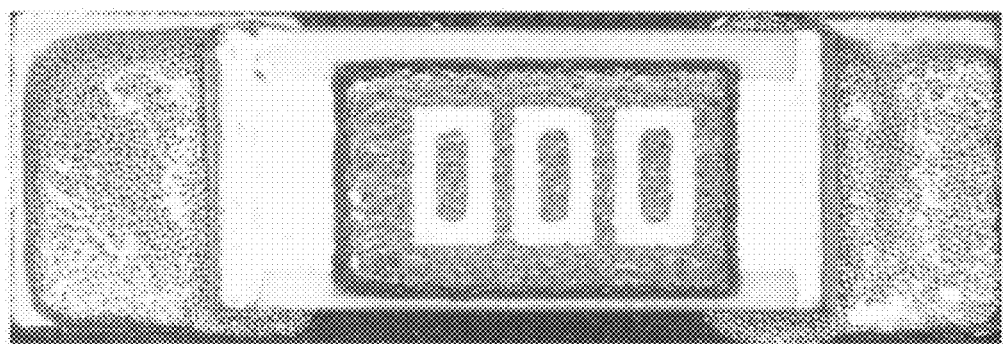
FIG. 2 is an enlarged photograph showing a preheated condition of particles in the solder material.

On the surface condition of the solder material, particles of the solder material (grained solder material) shown in FIG. 2 were used. FIG. 2 is a photograph of a preheated condition thereof in which a chip device (sample number, "000") is exemplified. By enlarging a part thereof as shown in FIG. 3, it is found out that the particles of the solder material are mixed all over the entire surface of the electrode. A predetermined amount of the particles of the solder material is heated at a temperature of the reflow furnace with them being heaped up.

Figure 5:
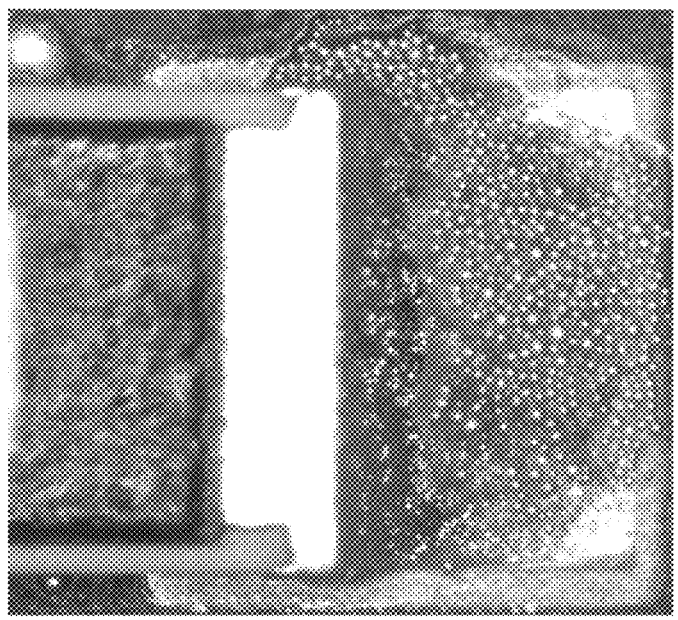
FIG. 5 is a photograph in which a part of FIG. 4 is further enlarged.

In this case, a condition in which the particles have not yet fully melted at the temperature of the reflow furnace is shown in FIG. 4 (sample number, "103") and an enlarged photograph of a part thereof is FIG. 5. It is found out that a part of the particles of the solder material has not yet fully melted.

Figure 7:
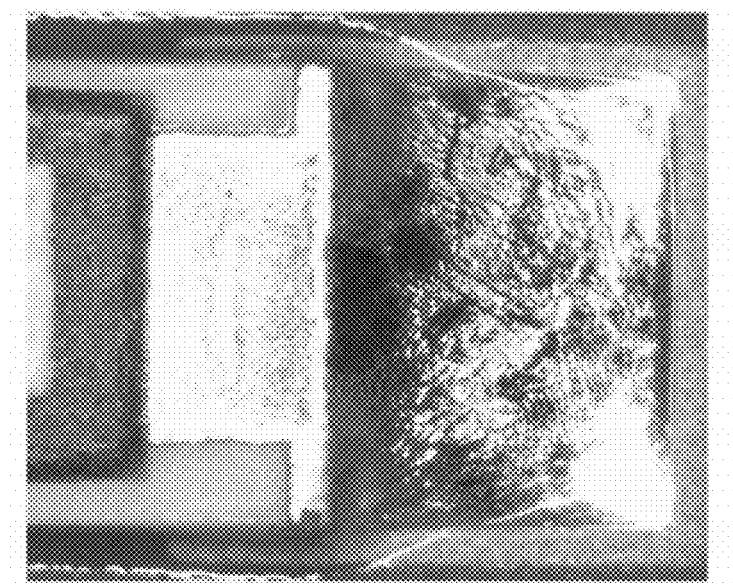
FIG. 7 is a photograph in which a part of FIG. 6 is further enlarged.

A condition in which the particles of the solder material have been fully melted is shown in FIG. 6 and an enlarged photograph thereof is FIG. 7. The melted condition is unsuitable such that the particles of the solder material remain on a surface thereof as shown in FIG. 4. The conditions shown in FIGS. 6 and 7 are ideal melted conditions to be searched.

The bonding strength is measured on the basis of a heat cycle test. In this example, a chip resistance device is exemplified. Solder paste of (Sn—Ag—Cu—Bi)-based solder material is printed and attached with a thickness of 150 μm onto a soldering pattern (1.6 mm×1.2 mm) of the printed circuit board. The chip resistance device of (3.2 mm×1.6 mm×0.6 mm) is then mounted thereon and is soldered in the reflow furnace at the heating temperature of 220 degrees C. The printed circuit board mounting the chip resistance device is then held under conditions of −55 degrees C. and +125 degrees C. for 30 minutes, respectively, as one cycle and when 1000 cycles are carried out, the bonding strength (N) is measured.

The bonding strength in which its mean value is high and the smallest value is shown at 20 degrees C. or higher is suitable, and an absolute value thereof among them is small is further suitable.

As being clear from the executed examples 1 through 9, the solidus temperatures thereof were 210 degrees C. or less. Their liquidus temperatures were almost 215 degrees C. or less. Since the surface conditions of any of the solder materials were good (perfect melted condition shown in FIG. 6), the bonding strength thereof also showed satisfactory values. Partially, there were the executed examples, the liquidus temperatures of which exceed 220 degrees C., but the surface conditions of the solder material and the bonding strength thereof showed fully satisfactory values.

Although the comparison examples 2 through 6 might show contents that exceeded those of the comparison example 1, they were inferior to the executed examples 1 through 9 in the surface conditions of the solder material (their partially unmelted condition) and the bonding strength. Therefore, as (Sn—Ag—Cu—Bi)-based solder material, it is said that the composition ratios included within the range as described above are suitable.

there was an executed example partially in which the liquidus temperature exceeded 215 degrees C., the surface condition of the solder material thereof was good and the mechanical bonding strength thereof showed suitable value.

It is determined that although there are examples having the contents which exceed those of the comparison example 1, they are inferior to the executed examples 17 through 24 in the surface condition of the solder material (a condition in which a part thereof is not melted) and the bonding strength. Therefore, it is said that the composition ratios included in the above-mentioned region are available for the (Sn—Ag—Cu—Bi—In)-based solder material.

TABLE 5

|  | Composition (by Mass %) | | | | | Melting Point (° C.) | | | Bonding Strength (N) After Heat Cycle Test After 1000 Cycles | | Surface Condition |
|  | | | | | | Solidus | Maximum Endothermal | Liquidus | Average | Minimum | of Solder |
|  | Sn | In | Bi | Ag | Cu | Temp. | Reaction Point Temp. | Temp. | Value | Value | Materials |
| --- | --- | --- | --- | --- | --- | --- | --- | --- | --- | --- | --- |
| Executed Example 17 | Remainder | 3 | 3 | 3 | 0.5 | 189 | 210 | 210 | 54 | 24 | FIG. 6 |
| Executed Example 18 | Remainder | 3 | 4 | 3 | 0.8 | 184 | 208 | 213 | 60 | 30 | FIG. 6 |
| Executed Example 19 | Remainder | 3 | 5 | 3 | 0.6 | 184 | 206 | 206 | 50 | 22 | FIG. 6 |
| Executed Example 20 | Remainder | 4 | 2 | 3 | 0.8 | 191 | 210 | 215 | 66 | 33 | FIG. 6 |
| Executed Example 21 | Remainder | 4 | 2 | 3 | 1 | 191 | 210 | 217 | 61 | 29 | FIG. 6 |
| Executed Example 22 | Remainder | 4 | 3 | 3 | 0.8 | 188 | 209 | 215 | 77 | 31 | FIG. 6 |
| Executed Example 23 | Remainder | 4 | 4 | 3 | 0.5 | 179 | 207 | 207 | 81 | 28 | FIG. 6 |
| Executed Example 24 | Remainder | 5 | 2 | 3 | 0.8 | 196 | 208 | 214 | 53 | 36 | FIG. 6 |
| Executed Example 25 | Remainder | 3 | 4 | 3 |  | 184 | 210 | 210 | 51 | 22 | FIG. 6 |
| Executed Example 26 | Remainder | 4 | 4 | 3 |  | 175 | 200 | 208 | 68 | 21 | FIG. 6 |
| Executed Example 27 | Remainder | 5 | 2 | 3 |  | 192 | 206 | 206 | 48 | 30 | FIG. 6 |
| Comparison Example 1 | Remainder | 0 | 3 | 0.5 |  | 217 | 220 | 220 | 30 | 18 | FIG. 6 |
| Comparison Example 7 | Remainder | 3 | 0.5 | 3 | 0.5 | 202 | 213 | 213 | 25 | 11 | FIG. 4 |
| Comparison Example 8 | Remainder | 3 | 7 | 3 | 0.4 | 165 | 204 | 204 | 45 | 13 | FIG. 6 |
| Comparison Example 9 | Remainder | 4 | 0.5 | 3 | 0.5 | 202 | 212 | 212 | 39 | 13 | FIG. 4 |
| Comparison Example 10 | Remainder | 4 | 5 | 3 | 0.8 | 173 | 205 | 213 | 62 | 17 | FIG. 6 |
| Comparison Example 11 | Remainder | 4 | 7 | 0.5 | 0.8 | 158 | 203 | 203 | 45 | 8 | FIG. 4 |
| Comparison Example 12 | Remainder | 5 | 1 | 3 | 1 | 199 | 209 | 216 | 67 | 19 | FIG. 4 |
| Comparison Example 13 | Remainder | 5 | 4 | 3 | 0.5 | 178 | 205 | 205 | 32 | 13 | FIG. 6 |
| Comparison Example 14 | Remainder | 0 | 0 | 3 | 0.5 | 217 | 220 | 220 | (Not Bonded) | | FIG. 4 |

Table 5 shows experimented examples (executed examples) when using (Sn—Ag—Cu—Bi—In)-based solder material. The comparison example 1 shows data when using the solder material of M705 specification and they are used as reference data.

Table 5 showed composition ratios of the solder material, a melting point at the maximum endothermal reaction point in addition to the solidus temperature and the liquidus temperature as the melting points, mechanical bonding strength and good or bad of a surface condition of the solder material, which were similar to Table 4. The surface conditions of the solder material were similar to any of FIGS. 3 through 6. The experiments of mechanical bonding strength were also similar to those of Table 4. However, the heating temperature of the reflow furnace was changed to 215 degrees C. to be experimented.

The solder material to be reference was alloy solder material of M705 specification, which was similar to a case of Table 4, and various kinds of properties of this solder material were used as the reference data.

As being clear from the executed examples 17 through 24, their solidus temperatures were below 200 degrees C. Their liquidus temperatures ware almost 215 degrees C. Since the surface conditions of the solder material were all good (their perfect melted conditions shown in FIGS. 6 and 7), the bonding strength thereof showed suitable values. Although Accordingly, as being clear from the examined results of Tables 1 through 5, in this inventions, (1) the (Sn—Ag—Cu—Bi)-based solder material, which is shown as composition ratios in Tables 2 or blow, or the (Sn—Ag—Cu—Bi—In)-based solder material, which is shown as composition ratios in Tables 3 or blow, is suitable for the mounting solder material 70.

(2) The (Sn—Sb)-based solder material in which the quantity of a constituent of Cu contained in impurities not more than 0.1% by mass is limited so as to be not more than 0.01% by mass is suitable for the die-bonding solder material 30. Particularly, the quantity of Cu constituent is 0.005% by mass or less, preferably, 0.001% by mass or less.

It has found in this case that Ni materials are preferable as plating materials to be used in the die pad electrode portions 22 and the heating temperature of the reflow furnace is preferably set so as to be 245 degrees C. or less, preferably, 240 degrees C. or less.

(3) It is to be noted that when the above-mentioned (Sn—Sb)-based solder material is used as the die-bonding solder material 30, P may be added thereto as at least a part of a mechanical strength improvement component. When further adding P, in miniscule quantities, within a range of 0.0001% through 0.01% by mass, into the above-mentioned (Sn—Sb)-based solder material, this leads to some improvement in wettability and voidness.

(4) Further, at least one element of Ni, Fe and Co may be added into the (Sn—Sb)-based solder material of the above-mentioned (3). In addition to or in place of P, at least one element of Ni, Fe and Co may be added thereto.

Adding at least one element of Ni, Fe and Co is because it prevents Ni plating layer 14 or 24 from being melted during a step of bonding by the solder material and prevents reaction amount of Ni plating generated during the bonding by the solder material from being brought up.

At least one element of Ni, Fe and Co within a range of a total amount of 0.01 through 0.1% by mass is added thereinto. When they are separately added by themselves (one kind of species is added), it is preferable that Ni is 0.1% by mass, Fe is 0.05% by mass or Co is 0.05% by mass. As a combination of these components, a combination of Ni and Co or Ni, Fe and Co is conceivable.

Thereafter, this applicant has diligently studied, so that it found that in order to attain the problem such that the die-bonding solder material could be prevented from being melted by soldering the surface-mount component using the die-bonding solder material and the mounting solder material, which had a difference between the solidus temperatures thereof, the problem could be attained even if there was no Cu constituent. The results therefor were shown in the executed examples 10 through 16 in Table 4 and the executed examples 25 through 27 in Table 5.

Although the executed examples 15 and 16 in Table 4 have apparently seen so as to be no problem, there were many voids in them so that they were consequently determined so as to be failed. As a result thereof, the results similar to the executed examples 1 through 9 were obtained by (Sn-(4~5)Bi-3Ag)-based soldering material or by adding any of or both of Ni of 0.02 through 0.1% by mass and/or Co of 0.01 through 0.1% by mass into (Sn-(4~5)Bi-3Ag)-based solder material.

Further, as shown in the executed examples 25 through 27 in Table 5, even in a case of (Sn-(3~5)In-(2~4)Bi-3Ag)-based solder material, the results similar to the executed examples 10 through 16 were obtained. An amount of the added Ag may be within a range from 2.8 to 3.3% by mass.

INDUSTRIAL APPLICABILITY

These inventions are applicable to a series of steps of manufacturing a surface-mount component in which a semiconductor device (IC chip) is subjected to a die bonding, the semiconductor device subjected to the die bonding is packaged and then, it is surface-mounted on a printed circuit board or the like, and the surface-mount component manufactured by these steps of manufacturing it.

DESCRIPTION OF CODES

10 . . . Semiconductor Device (IC chip); 14, 24 . . . Ni plating Layer; 16, 26 . . . Au plating Layer; 20 . . . Lead Frame; 22 . . . Die Pad Electrode Portion (Island Portion); 34 . . . Lead Portion; 34a . . . Inner Terminal Portion; 34b . . . Outer Terminal Portion; 30 . . . Die-Bonding Solder Material; 38 . . . Heat Sink Plate; 40 . . . Electrode Wire; 50 . . . Surface Mount Component; 60 . . . Printed Circuit Board; 62 . . . Board Terminal Portion (Land); and 70 . . . Mounting Solder Material.

The invention claimed is:

1. A method of soldering a surface-mount component, the method comprising the steps of:
    forming the surface-mount component by attaching a circuit element to a lead frame, the circuit element having an electrode surface on which a first Ni plating layer is present, and the lead frame having a die pad electrode surface on which a second Ni plating layer is present, and soldering the first Ni plating layer to the second Ni plating layer using (Sn—Sb)-based solder material wherein the (Sn—Sb)-based solder material consists of Sb in an amount of not less than 10% to less than 11% by mass, Cu within a range of 0.0001 to 0.01% by mass, a mechanical strength improvement component including P within a range of 0.0001% to 0.01% by mass and at least one element from the group consisting of Ni, Co, and Fe within a range of 0.01% through 0.1% by mass, and the balance of the (Sn—Sb)-based solder material being Sn and inevitable impurities, so as to prevent the (Sn—Sb)-based solder material from being melted when the surface-mount component is soldered onto a board terminal portion of a circuit board; and
    soldering the surface-mount component onto the board terminal portion of the circuit board, using (Sn—Ag—Cu—Bi)-based solder material applied on the board terminal portion.

2. The method of soldering a surface-mount component according to claim 1, wherein the lead portion of the lead frame to be used in the surface-mount component is covered by a plating layer chosen from the group consisting of a Sn plating layer and a Sn—Bi plating layer.

3. A method of soldering a surface-mount component, the method comprising the steps of:
    forming the surface-mount component by attaching a circuit element to a lead frame, the circuit element having an electrode surface on which a first Ni plating layer is present, and the lead frame having a die pad electrode surface on which a second Ni plating layer is present, and soldering the first Ni plating layer to the second Ni plating layer using (Sn—Sb)-based solder material wherein the (Sn—Sb)-based solder material consists of Sb in an amount of not less than 10% to less than 11% by mass, Cu within a range of 0.0001 to 0.01% by mass, a mechanical strength improvement component including P within a range of 0.0001% to 0.01% by mass and at least one element from the group consisting of Ni, Co, and Fe within a range of 0.01% through 0.1% by mass, and the balance of the (Sn—Sb)-based solder material being Sn and inevitable impurities, so as to prevent the (Sn—Sb)-based solder material from being melted when the surface-mount component is soldered onto a board terminal portion of a circuit board; and
    soldering the surface-mount component onto the board terminal portion of the circuit board, using (Sn—Ag—Cu—Bi—In)-based solder material applied on the board terminal portion.

4. The method of soldering a surface-mount component according to claim 3, wherein the lead portion of the lead frame to be used in the surface-mount component is covered by a plating layer chosen from the group consisting of a Sn plating layer and a Sn—Bi plating layer.

* * * * *